United States Patent [19]

Maeda et al.

[11] Patent Number: 4,731,255
[45] Date of Patent: Mar. 15, 1988

[54] GAS-PHASE GROWTH PROCESS AND AN APPARATUS FOR THE SAME

[75] Inventors: Kazuo Maeda; Noboru Tokumasu; Toshihiko Fukuyama; Tsugiaki Hirata, all of Tokyo, Japan

[73] Assignee: Applied Materials Japan, Inc., Tokyo, Japan

[21] Appl. No.: 780,205

[22] Filed: Sep. 26, 1985

[30] Foreign Application Priority Data

Sep. 26, 1984 [JP] Japan ................... 59-201230
Sep. 28, 1984 [JP] Japan ................... 59-204975

[51] Int. Cl.⁴ ................................ B05D 3/06
[52] U.S. Cl. ........................ 427/54.1; 118/50.1
[58] Field of Search ............... 427/53.1, 54.1; 118/50.1, 620, 725, 728

[56] References Cited

U.S. PATENT DOCUMENTS

| | | | |
|---|---|---|---|
| 3,200,018 | 8/1965 | Grossman | 427/82 |
| 3,271,180 | 9/1966 | White | 427/99 |
| 3,364,087 | 1/1968 | Solomon et al. | 427/88 |
| 4,331,485 | 5/1982 | Gat | 427/55 |
| 4,435,445 | 3/1984 | Allred | 427/54.1 |
| 4,454,835 | 6/1984 | Walsh et al. | 118/712 |
| 4,500,565 | 2/1985 | Hiramoto | 427/39 |

FOREIGN PATENT DOCUMENTS 140367 8/1984 Japan ................... 427/53.1

*Primary Examiner*—John H. Newsome
*Attorney, Agent, or Firm*—Birch, Stewart, Kolasch & Birch

[57] ABSTRACT

A gas-phase growth process for growing films of uniform thickness or having a prescribed pattern form or growing films sequentially onto a substrate and an apparatus related thereto. The films are grown by allowing an inert gas to flow over a reaction gas flow in parallel to the surface of the substrate. Optionally, the substrate surface could be irradiated by a UV light source which is directed from above the inert gas toward the substrate surface.

22 Claims, 13 Drawing Figures

GAS-PHASE GROWTH PROCESS AND AN APPARATUS FOR THE SAME

FIELD OF THE INVENTION AND RELATED ART STATEMENT

Typical conventional gas-phase growth apparatus are shown in FIGS. 11, 12, and 13. In the apparatus shown in FIG. 11, dispersing plate 12 is provided within a reaction chamber (not shown) and in parallel with susceptor 10. A reaction gas is dispersed by dispersing plate 12 so as to be supplied vertically toward the surface of wafer 14. In the apparatus shown in FIG. 12, within a reaction chamber (not shown) a reaction gas is supplied radially from nozzles 16 toward wafer 14. In the apparatus shown in FIG. 13, a reaction gas is allowed to flow within reaction tube 18 in parallel to the surface of wafer 14.

The above-described gas-phase growth apparatus have the following problems.

The problems associated with the apparatus shown in FIGS. 11 and 12 are as follows. Gas-phase reaction products (in particle) will float in the reaction gas or will adhere onto the wall of reaction chamber. These products caused by the flow or blowing-up of a reaction gas will be deposited onto the film which is growing on the surface of a substrate. This unfavorable phenomenon is called particle generation. The apparatus shown in FIG. 12 is additionally has the problem in that the reaction products will deposit onto nozzles 16 and completely clogged the nozzles.

The apparatus shown in FIG. 13 has the following problems. Gas-phase reaction products formed in the reaction gas are usually easy to remove while floating in the flow of the reaction gas. However, since the reaction gas is generally supplied in an irregular flow (flow disturbance is enhanced by the reaction gas being heated near wafer 14), particles produced in the gas-phase will be deposit onto films which are growing on wafer 14, which causes the phenomenon of particle generation. Particle generation will also be formed from the reaction products which will be deposited onto the inner wall of reaction tube 18 said formation being caused by the irregular flow of the reaction gas wherein said particle generated, will be deposited onto the film.

OBJECT AND SUMMARY OF THE INVENTION

The present invention has been developed through efforts to solve the above-described problems. An object of the present invention is to provide a novel gas-phase growth process in which reaction gas and inert gas are supplied onto the surface of a substrate in a laminar flow with the inert gas so positioned as to cover the reaction gas, and wherein said process is effective for eliminating a reaction chamber and almost completely suppressing particle generation.

A further object of the present invention is to provide a novel gas-phase growth apparatus which is capable of supplying both the reaction gas and the inert gas in a secured laminar flow by means of reaction-gas supply nozzles and inert-gas supply nozzles.

A still further object of the present invention is to provide a novel gas-phase growth apparatus which is capable of preheating both the reaction gas and the inert gas for the purpose of establishing a better laminar-flow condition for both gases.

Another object of the present invention is to provide a novel gas-phase growth apparatus which is capable of allowing both the reaction gas and the inert gas to flow in a laminar flow and allowing UV light to irradiate over the inert gas toward the surface of a substrate. This would permit a reaction to take place at lower temperatures and make it possible to adopt a temperature which is sufficiently low so as not to induce a reaction, which would allow the heating condition not to be a requirement for the formation of a better laminar flow (reaction is to be initiated by UV irradiation at a later stage).

DETAILED DESCRIPTION OF PREFERRED EMBODIMENTS

Suitable embodiments of the present invention are described below in detail by the accompanying drawings. In the description below, the process of the present invention, which is closely related with the apparatus of the present invention, will be described together.

Figure 1:
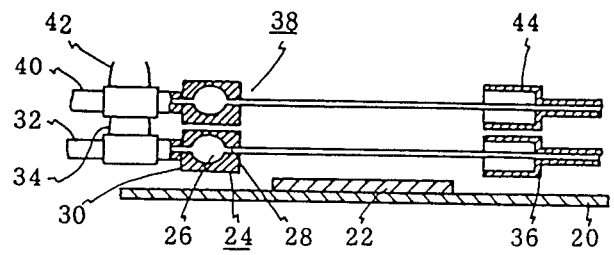
FIG. 1 is a partial sectional view illustrating the outline of the apparatus of the present invention.

FIG. 1 is a schematic representation of an outline of the apparatus of the present invention.

Hot plate 20 holds a wafer 22 to heat it to near the reaction temperature.

Figure 2:
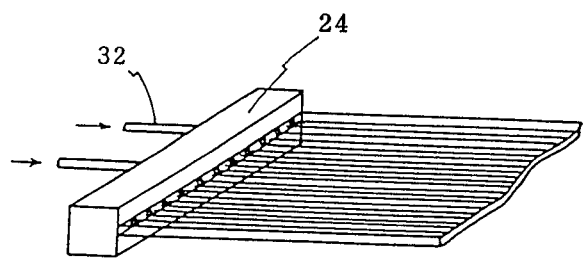
FIG. 2 is a schematic view illustrating the reaction-gas supply nozzle of the apparatus of FIG. 1.
Figure 3:
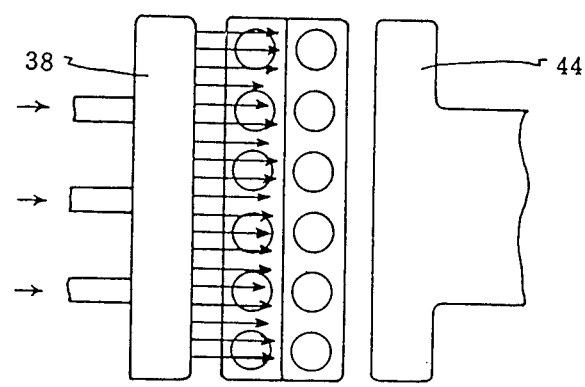
FIG. 3 is a plan for the apparatus of FIG. 1.

Reaction-gas supply nozzle 24 is positioned on one side of hot plate 20 and allows a reaction gas to flow in parallel to the surface of wafer 22. Reaction-gas supply nozzle 24 is provided with hollow gas-reservoir 26. Nozzle proper 30, is provided with great numbers of gas-jet outlets 28 in the form of slit or small hole, communicates with the gas reservoir 26, and is connected to gas supply pipe 32 (FIGS. 1 and 2). Thus, we may have a flow of a reaction gas in a band several centimeters wide from nozzle proper 30 along the surface of wafer 22.

Reaction-gas heating coil 34 is wound at suitable places on supply pipe 32 and serves to heat a reaction gas to the surface temperature of wafer 22 before its passage over wafer 22.

Exhaust pipe 36 is positioned on the other side of hot plate 20 opposite reaction-gas nozzle 24, with wafer 22 positioned inbetween, and serves to remove the unreacted gas and the gas-phase reaction products.

$N_2$-gas (inert gas) supply nozzle 38 has a structure similar to reaction-gas supply nozzle 24 and, is positioned over reaction-gas supply nozzle 24, which serves to allow $N_2$ gas to flow in the form of a band over a reaction-gas flow from reaction-gas supply nozzle 24. The $N_2$ gas, before being supplied, is heated to almost the same temperature as the reaction-gas by means of heating coil 42 wound on N₂ gas supply pipe 40.

N₂-gas exhaust pipe 44 serves to remove the above-mentioned N₂ gas.

The present invention is embodied as described above.

The apparatus described above enables us to flow a preheated reaction gas in a band form from reaction-gas supply nozzle 24 along the surface of wafer 22 and also preheated N₂ gas in a band form over the reaction gas, with a formation of a prescribed film over the surface of wafer 22. In this regard, problems, such as particle generation will not occur since both gases, are preheated to almost the same temperature and accordingly in the absence of a disturbed flow inbetween, the gases are supplied in laminar flows so that no reaction products formed in the reaction gas phase will be deposited onto the surface of wafer 22.

Inorganic silane systems such as $SiH_4$—$O_2$ and $SiH_4$—$PH_3$—$O_2$ as reaction-gas systems may be utilized for the formation of $SiO_2$ and PSG films.

In the above-listed systems, for example, with $SiH_4$—$O_2$, it may happen that if a reaction gas is preheated by heating coil 34 to a reaction temperature of ca. 400° C., a reaction will occur, for example, within reaction-gas supply nozzle 24. Thus, it is preferable that reaction gas which is to be preheated by heating coil 34 to a temperature, e.g., ca. 200° C., be incapable of inducing reaction (with N₂ gas also preheated to ca. 200° C.) and to be heated to the reaction temperature near wafer 22 by means of a separate suitable heating source.

Figure 4:
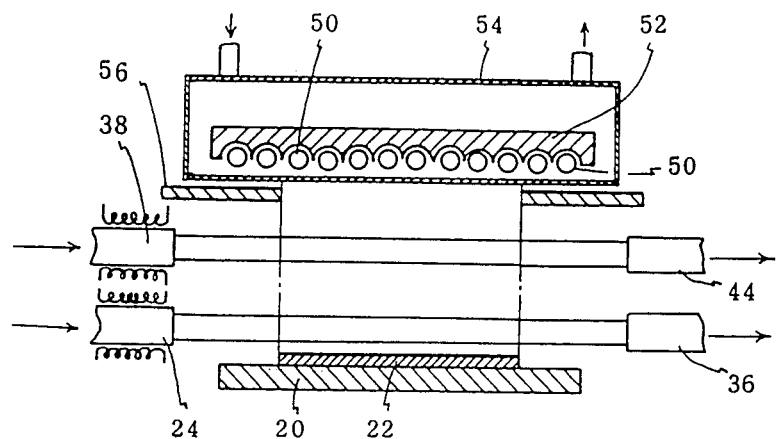
FIG. 4 is a partial sectional view of another apparatus.

FIG. 4 shows another embodiment.

This embodiment is the same as the one above except for the provision of a UV-irradiation lamp.

UV-irradiation lamp 50 (Hg lamp) is positioned over the N₂ gas flow and serves to irradiate the surface of wafer 22 placed on hot plate 20, and is provided with reflection plate 52.

Box 54 accommodates UV-irradiation lamp 50 and has N₂ gas flowing inside. The N₂-gas flow inside box 54 is used since O₂ gas, if present, will absorb the UV light.

Cover 56 made of quartz glass has its outer section covered with a UV-opaque film such as a deposited chromium film so as to be capable of allowing UV light to pass through the middle UV-transparent section and irradiate the surface of wafer 22.

This embodiment preferably utilizes reaction-gas systems which are capable of getting photo-excited by UV irradiation.

The reaction-gas systems preferably available for this embodiment include systems of organic silane (tetraethoxysilane)—$O_2$ and organic silane—$PH_3$ (or organic phosphorus)—$O_2$.

In general, such organic silane systems cannot enter into a reaction below 700° C. However, the present inventor has found that even such organic silane systems are allowed to react satisfactorily at temperatures which are as low as ca. 400° C. in the presence of UV irradiation.

The above-mentioned fact is very important to the embodiment under consideration. A reaction gas and a N₂ gas may be preheated to ca. 400° C. before being introduced. At this temperature no reaction is induced in the reaction gas. The reaction gas will initiate a reaction within the region of irradiation by UV lamp 50, resulting in a formation of a film on wafer 22. As described above, both the reaction gas and the N₂ gas may be preheated before being subjected to the temperature at which the reaction gas will later be used to initiate the reaction, so that no additional heating sources are required. No particle generation occurs as in the preceding embodiment since both the reaction gas and the N₂ gas are designed to flow in the form of laminar flows.

The UV-induced reaction of the above-specified organic-silane reaction systems is further characterized by the fact that the relevant reaction is a surface reaction taking place on the surface of substrate. In consequence, the UV-induced reaction is capable of allowing films to grow uniformly irrespective of dented and projected sections, resulting in step coverage (uniform adhering performance).

In this embodiment, we may set a suitable mask (not shown) at a short distance over wafer 22 to permit films to grow on wafer 22 in accord with the mask pattern. The mask should be made of a UV-transparent material such as quartz glass. The UV-opaque sections are formed, for example, by chromium deposition as with cover 56 mentioned above.

Reaction-gas systems, other than the above-listed, which are useful for this embodiment include systems of $SiH_4$—$O_2$ (capable of reaction at ordinary temperature under UV irradiation), $SiH_4$—$N_2O$, —$CO_2$, —$NO_2$, —NO, and —$NH_3$ (capable of reaction around 400° C. under UV irradiation), and organic silane—$NO_2$, —$CO_2$, —$N_2O$, —NO, and —$NH_3$ (capable of reaction around 400° C. under UV irradiation).

N₂ gas has been specified as the carrier gas for the reaction gas, but He gas may also be used as the carrier gas. With He gas, it is much easier to arrange and maintain the laminar flow condition, for the following reason.

As Table 1 indicates, He gas has a low weight (low viscosity) and an extremely high thermal conductivity in comparison with the N₂ and the Ar gases.

TABLE 1

|  | Density g l$^{-1}$ | Thermal conductivity cal cm$^{-1}$ s$^{-1}$ deg$^{-1}$ |
| --- | --- | --- |
| He | 0.1785 | 3.19 × 10$^{-4}$ |
| N₂ | 1.2506 | 58.0 × 10$^{-6}$ |
| Ar | 1.784 | 3.9 × 10$^{-5}$ |

He gas which has a low viscosity is effective for preventing peripheral gases from being involved so as to facilitate the maintenance of a laminar flow condition.

Moreover, H₂ gas which has a high thermal conductivity will permit the flowing reaction gas to get heated rapidly and uniformly so as to facilitate the formation of laminar flow condition. The capability of obtaining uniformly heated results from a smooth operating reaction, leads to the formation of films of uniform thickness.

Figure 5:
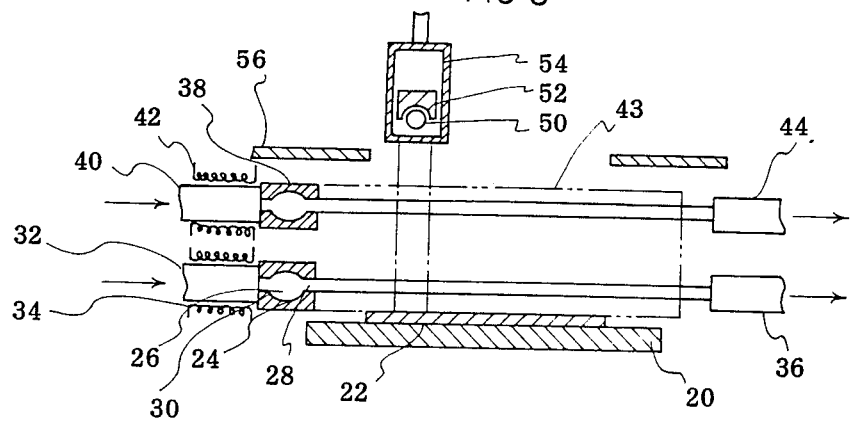
FIG. 5 is a partial sectional view of another apparatus.

FIG. 5 shows another embodiment.

The components functioning in this embodiment and in the preceding embodiment will be designated with the same figures for identification.

UV-irradiation lamp 50 (Hg lamp) is positioned over wafer 22 in a direction which is perpendicular to the flow direction of both gases. UV-irradiation lamp 50, which serves to irradiate, from over a N₂ gas flow, the surface of wafer 22 said wafer having been placed on hot plate 20, is composed of one or two discharge tubes and irradiates UV light in the form of a band onto part of wafer 22.

Box 54 accommodates UV-irradiation lamp 50 and is provided with reflection plate 52. Box 54 has N₂ gas flowing inside as in the preceding embodiment.

Box 54 is driven back and forth by a reciprocating driver (not shown) in a plane parallel to hot plate 20 along the gas flow. This reciprocating movement of box 54 allows the UV light from UV-irradiation lamp 50 to irradiate the surface of wafer 22 sequentially from one edge of wafer 22 to the other.

The above-mentioned reciprocating driver may be composed of a rail mechanism, which is capable of guiding both ends of box 54 to slide in a horizontal plane, a reversible motor which is capable of reciprocating box 54 along this rail mechanism, etc.

In this embodiment, based on the reciprocating movement of UV-irradiation lamp 50 over wafer 22, UV light in the form of a band, is allowed to scan back and forth over the wafer, making films grow sequentially. In greater detail, the UV irradiation of wafer 22 is effected by the reciprocating movement of the UV-irradiation lamp which is composed of one or about two discharge tubes. Therefore, this mechanism by far allows a more uniform irradiation and accordingly a growth of films having a more uniform thickness than mechanisms which employ 10 stationary discharge tubes having slightly mutually different discharge characteristics to separately irradiate a plurality of wafers.

In the above described embodiment, the hot plate 20 is fixed with UV-irradiation lamp 50 which is designed to reciprocate. However, the same effect may be expected if hot plate 20 is made to move back and forth with UV-irradiation lamp 50 being in a fixed position. Moreover, both hot plate 20 and UV-irradiation lamp 50 may be set in a manner which would permit reciprocating movements.

Figure 6:
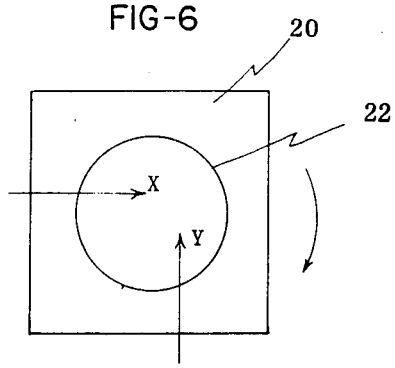
FIG. 6 is for illustrating a rotatable hot plate.

As a modification of this embodiment, hot plate 20 may be designed to be capable of being rotated to an angle of 90° (or arbitrary angles) as shown in FIG. 6. With such a mechanism, we are able to first drive the UV-irradiation lamp back and forth in the X direction to initiate the gas-phase growth, and then, after rotating hot plate 20 90°, resume the UV-irradiation lamp reciprocating movement (in the Y direction). The capability of this mechanism to have movements in both the X and Y directions is effective for further promotion of uniform growth of films.

Figure 7:
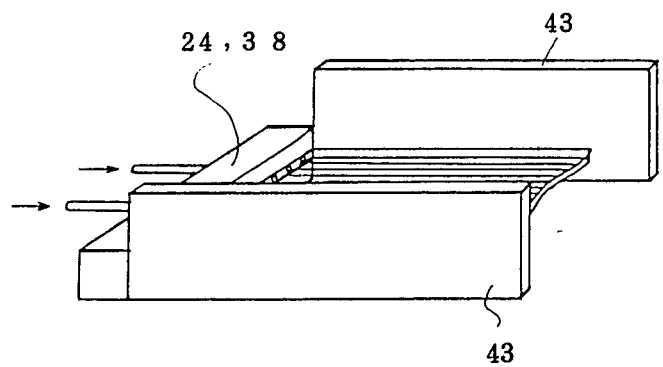
FIGS. 7 and 8 are a perspective views and plans respectively, for the provision of nozzles with blocking plates.
Figure 8:
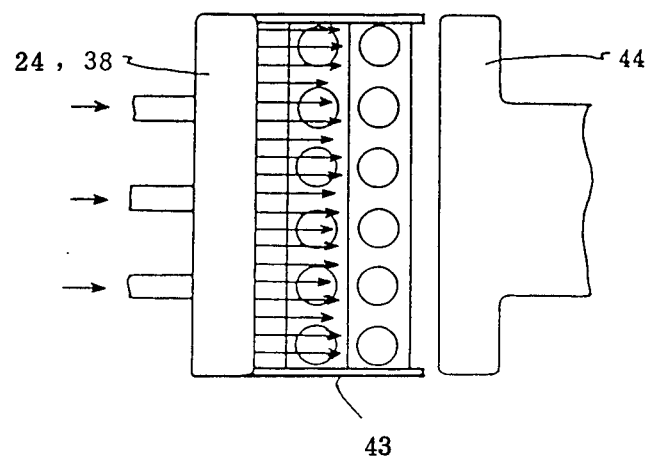

FIGS. 7 and 8 show another embodiment of reaction-gas supply nozzle 24 and the inert-gas supply nozzle 28.

In this embodiment, blocking plates 43 are provided in such a way that they are set vertical on both sides of reaction-gas supply nozzle 24 and N₂-gas supply nozzle 38, extending from the nozzle along the gas-flow direction. Blocking plates 43 serve to keep the reaction gas and the N₂ gas from coming into contact with the surrounding air.

The provision of the blocking plates 43 is to provide an effective separation of both gases from the surrounding air and is also used for establishing and maintaining a better laminar-flow condition by preventing both gases from being involved in irregular flows.

It is preferable that blocking plates 43 be composed of hot plates. Such blocking plates may be heated to a temperature which is almost the same as the temperature of the reaction gas and the N₂ gas, so that the heating source would tend to provide a lower than normal temperature for the outer section where the gas flows. Thus, the use of such blocking plates is effective for keeping both gases at the same temperature and keeping the gas flow from being disturbed due to a thermal unbalance condition.

Figure 9:
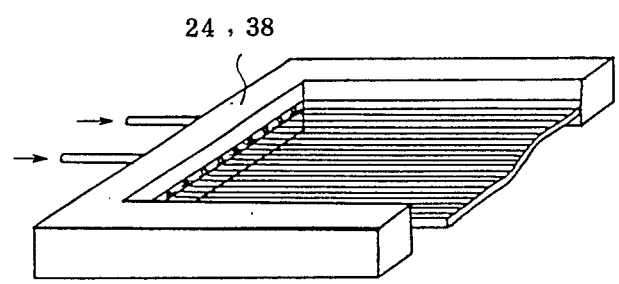
FIGS. 9 and 10 are a perspective views and plans respectively, for the arrangement of nozzles in a U form.
Figure 10:
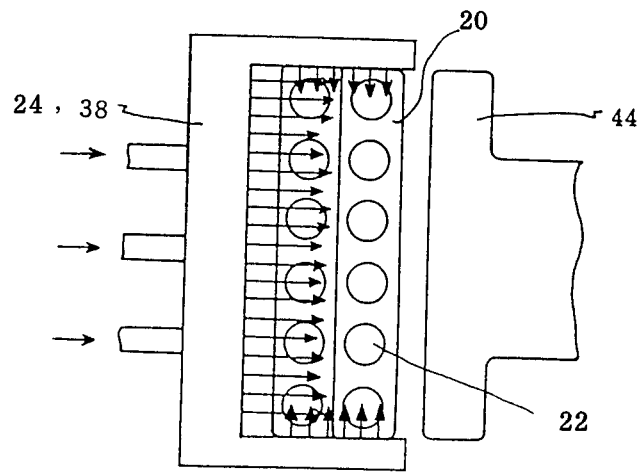
Figure 11:
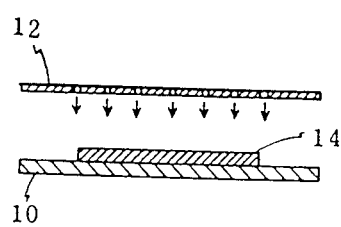
FIGS. 11, 12, and 13 show conventional gas-phase growth apparatus.
Figure 12:
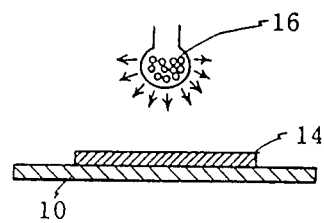
Figure 13:
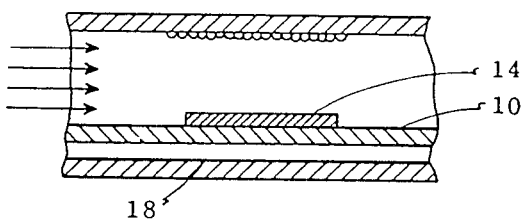

FIGS. 9 and 10 show another embodiment for reaction-gas supply nozzle 24 and inert-gas supply nozzle 38.

In this embodiment, both reaction-gas supply nozzles 24 and inert-gas supply nozzles 38 are in a U-shaped arrangement. Both nozzles are designed to gush out the gases toward wafer 22, said wafer having been placed on hot plate 20 from three directions but not from the gas exhaust direction. In this regard, an adjustment should be made so that the rate of gas being supplied in the gas exhaust direction exceeds the rate with which the gas is being laterally supplied toward wafer 22.

In this embodiment, the gas is allowed to gush out not only from the middle section but also from the side walls; the lateral gas supplies serve to prevent the middle supply from diffusing out toward the outside. Such a mechanism will result in a uniform gas flow over entire hot plate 20, which in turn promotes the progress of a uniform reaction.

In addition, such a mechanism prevents flow disturbances from being caused by the tendency of a gas to diffuse outward and accordingly is effective for supplying both gases in favorable laminar flows.

We claim:

1. A gas-phase growth process for growing films of uniform thickness or having a prescribed pattern form or growing films sequentially onto a substrate, which comprises:

flowing a reaction gas over the surface of said substrate in parallel with said surface;

flowing an inert gas over the flow of said reaction gas so as to create a laminar flow with the flow of said reaction gas;

preheating both gases to about the same temperature, so as to induce a surface reaction of the reaction gas; and growing a film onto the substrate, said process being conducted in the absence of a reaction chamber and with generally a complete particle generation suppression.

2. The gas-phase growth process according to claim 1, wherein a carrier gas is used for said reaction gas.

3. The gas-phase growth process according to claim 2, wherein said carrier gas is He.

4. A gas-phase growth process for growing films of uniform thickness or having a pattern form or growing films sequentially onto a substrate, which comprises:

flowing a reaction gas over the surface of said substrate in parallel with said surface;

flowing an inert gas over the flow of said reaction gas so as to create a laminar flow with the flow of said reaction gas;

directing UV light over the inert gas toward the surface of the substrate and irradiating said surface to effect photo excitation of said reaction gas;

preheating both gases to about the same temperatures, to induce a surface reaction of the reaction gas by the energy of said UV light; and growing a film onto the substrate, said process being conducted in the absence of a reaction chamber and with almost a complete particle generation supression.

5. The gas-phase growth process according to claim 4 wherein a carrier gas is used for said reaction gas.

6. The gas-phase growth process according to claim 5 wherein said carrier gas is He.

7. The gas-phase growth process according to claim 4, wherein the reaction gas comprises an inorganic silane system.

8. The gas-phase growth process according to claim 4, wherein said reaction gas comprises an organic silane system.

9. The gas-phase growth process according to claim 4, wherein said surface is irradiated through a mask with a prescribed pattern.

10. The gas-phase growth process according to claim 9, wherein both gases are preheated to almost the same temperature, in which said temperature is about 400° C. prior to being subjected to the flowing steps.

11. The gas-phase growth process according to claim 4, wherein the process includes moving a UV light source of said UV light and said substrate relatively back and forth.

12. The gas-phase growth process according to claim 11, wherein a carrier gas is used for said reaction gas and the reaction gas, the inert gas and the carrier gas are preheated to almost the same temperature prior to being subjected to the flowing steps.

13. The gas-phase growth process according to claim 12, wherein said surface is irradiated through a mask with a prescribed pattern.

14. The gas-phase growth process according to claim 1, wherein said reaction gas comprises an inorganic silane system.

15. The gas-phase growth process according to claim 1, wherein said reaction gas comprises an organic silane system.

16. A gas-phase growth apparatus for growing films of uniform thickness or having a pattern form or growing films sequentially onto a substrate, which comprises:
    reaction-gas supply nozzles for flowing a reaction gas over the surface of said substrate in parallel with said surface;
    inert-gas supply nozzles for flowing an inert gas over the flow of said reaction gas so as to create a laminar flow with the flow of said reaction gas; and
    a heating means serving to preheat both gases to about the same temperature, said apparatus further characterized as not being comprised of a reaction chamber.

17. The gas-phase growth apparatus according to claim 16, wherein blocking plates, which serve to block out the air surrounding the apparatus, are provided, said plates extending forward on both sides from said reaction-gas supply nozzles and said inert-gas supply nozzles.

18. The gas-phase growth apparatus according to claim 16, wherein said reaction-gas nozzles and said inert-gas supply nozzles are in a U-shaped arrangement so as to surround said substrate except for a gas exhaust direction.

19. A gas-phase growth apparatus for growing films of uniform thickness or having a pattern form or growing films sequentially onto a substrate, which comprises:
    reaction-gas supply nozzles for flowing a reaction gas over the surface of said substrate in parallel with said surface; and
    inert-gas supply nozzles for flowing an inert gas over the flow of said reaction gas so as to create a laminar flow with the flow of said reaction gas;
    an UV-irradiation source serving to irradiate UV light onto said surface of the substrate; and
    a heating means serving to preheat both gases to almost the same temperature, to induce a surface reaction of the reaction gas with the energy of said UV light, said apparatus further characterized as not being comprised of a reaction chamber.

20. The gas-phase growth apparatus according to claim 9, wherein blocking plates which serve to block out the air surrounding the apparatus are provided, said plates extending forward on both sides from said reaction-gas supply nozzles and said inert-gas supply nozzles.

21. The gas-phase growth apparatus according to claim 19, wherein said reaction-gas nozzles and said inert-gas supply nozzles are in a U-shaped arrangement so as to surround said substrate except for a gas exhaust direction.

22. The gas-phase growth apparatus according to claim 19, wherein a driving means is provided which is capable of moving said UV-irradiation source and said substrate relatively back and forth in parallel planes.

* * * * *